United States Patent [19]

Gersbach et al.

[11] Patent Number: 5,101,203
[45] Date of Patent: Mar. 31, 1992

[54] DIGITAL DATA REGENERATION AND DESERIALIZATION CIRCUITS

[75] Inventors: John E. Gersbach; Ilya I. Novof, both of Burlington, Vt.

[73] Assignee: International Business Machines Corporation, Armonk, N.Y.

[21] Appl. No.: 546,192

[22] Filed: Jun. 29, 1990

[51] Int. Cl.$^5$ .............................................. H03M 9/00
[52] U.S. Cl. ........................................ 341/100; 377/80
[58] Field of Search ................... 341/100, 59, 68, 101; 370/18; 377/73, 80

[56] References Cited

U.S. PATENT DOCUMENTS

| | | |
|---|---|---|
| 4,393,301 | 7/1983 | Svendsen . |
| 4,429,300 | 1/1984 | Yamasawa et al. . |
| 4,485,347 | 11/1984 | Hirasawa et al. . |
| 4,584,695 | 4/1986 | Wong et al. . |
| 4,677,648 | 6/1987 | Zurfluh . |
| 4,682,321 | 7/1987 | Okumura et al. . |
| 4,901,076 | 2/1990 | Askin et al. ........................ 341/100 |

OTHER PUBLICATIONS

Rein, Hans-Martin, Multi-Gigabit-Per-Second Silicon Bipolic Ic's for Future Optical-Fiber Transmission Systems, IEEE Jor. of Solid State Circuits, vol. 23, No. 3, pp. 664-675, 1988.
Lindsey et al., Survey of Digital Phase-Locked Loops, Proceedings of the IEEE, vol. 69, No. 4, pp. 410-431, 1981.
W. I. Fletcher, "Engineering Approach to Digital Design", 1980 Prentice-Hall, Inc. p. 304.

Primary Examiner—A. D. Pellinen
Assistant Examiner—Brian K. Young
Attorney, Agent, or Firm—Heslin & Rothenberg

[57] ABSTRACT

A substantially simultaneous digital data regeneration and deserialization technique for communication systems and information and data processing systems is disclosed. A digital phase lock logic circuit (DPLL) receives the serial stream of clock and data bits at its input and outputs a plurality of clock signals with different phase. A plurality of latches are coupled to receive a respective one of the clock output signals from the DPLL. Each latch receives the serial stream of clock and data bits through a second input such that the latches are sequentially set by substantially simultaneously received clock and data information at the two inputs and the serial data bits within the stream appear as parallel data bits at the latch outputs. Enhanced versions of this circuit are also described, along with an alternate embodiment which uses an analog phase locked loop circuit.

6 Claims, 4 Drawing Sheets

DIGITAL DATA REGENERATION AND DESERIALIZATION CIRCUITS

BACKGROUND OF THE INVENTION

1. Technical Field

This invention relates in general to communication systems and information and data processing systems, and more particularly, to digital data regeneration and deserialization techniques for such systems.

2. Description of the Prior Art

In optical fiber transmission systems the trend is to increase the data rate further to exploit the high transmission capacity of single-mode optical fibers. The limiting factor for data rate increases is usually not the optical fiber data carrying capability, but rather electronic circuit performance. In digital communication networks, such as fiber optic transmission systems, the data sampling clock signal is usually recovered from the incoming serial data stream. At the communication link receiving end, the transmitted serial data stream must be regenerated and deserialized. In many such communication systems, phase locked loops (PLLs) are used for recovery of the clock signal that corresponds in frequency and phase to the clock of the data stream transmitted through the network and received at the station. Data deserialization is typically accomplished by a special circuit called the deserializer. The PLL and deserializer are considered to be critical components in the data communication network. These circuits traditionally operate at the serial data stream rate and usually limit communication channel data carrying capability.

FIG. 1 depicts a conventional regeneration and deserialization circuit, generally denoted 10. Circuit 10 receives an equalized and amplified serial data signal on data line 12 which is coupled to a PLL circuit 14 and a data latch 16. PLL circuit 14 recovers a clock signal from the serial data stream and data is retimed by latch 16. The clock output 18 of PLL circuit 14 is input to latch 16 and a ring counter 20. Retimed serial data on output line 22 of data latch 16 is then deserialized into Q parallel bits through a plurality of latches 24. This is accomplished by applying regenerated data on line 22 to each data latch 24 via a first input, and the clock signal outputs of different phase from ring counter 20 to respective second inputs of data latches 24. Each serial bit is clocked into a single latch by one of the ring counter's output clocks CLK(1), CLK(2),..., CLK(Q). Once all parallel bits are latched, they are clocked to a second parallel register (not shown) via a clock pulse occurring slightly after the last deserialization clock.

In this conventional regeneration and deserialization circuit embodiment, retiming latch 16 operates at the data clock frequency, "f", while latches 24 function at 1/Qth the data clock frequency, i.e., f/Q. With existing technology, latch 16 is near its limit of operation and relatively unreliable at high data transmission rates. For example, optical fiber transmission systems are capable of operating at a one nanosecond data rate.

The present invention, therefore, is designed to solve this performance limitation of conventional digital data regeneration and deserialization techniques and thus allow for higher data rate signal processing for a given system.

SUMMARY OF THE INVENTION

Briefly described, a serial stream of clock and data bits is simultaneously regenerated and deserialized into a parallel data format pursuant to the present invention. In one circuit embodiment, the invention includes a digital phase lock logic circuit having an input for receiving the serial signal stream and a plurality of clock outputs each of different phase. A plurality of latches, each having first and second inputs, are each coupled through the first inputs to receive a respective clock output from the logic circuit. The second latch inputs are each capable of receiving the serial signal stream. When the serial stream is fed to the digital phase lock logic circuit and to the latches, the latches are sequentially set by substantially simultaneously received clock and data information at the first and second inputs such that serial data bits within the stream appear as parallel data bits at the latch outputs.

In an enhanced regeneration and deserialization circuit version, the plurality of latches are grouped into sets and the digital phase lock logic circuit has a timing pulse output. The circuit further includes a plurality of AND gates and a ring counter. One input to each AND gate is connected to a respective clock output of the digital phase lock logic circuit and the other is connected to a respective output of the ring counter. The ring counter is coupled to the digital phase lock logic circuit to receive the timing pulse output such that the counter's output signals function to sequentially switch the applied output clocks from the digital phase lock logic circuit between latch sets.

In an analog embodiment of the present invention, the serial stream of combined clock and data bits is initially fed to an analog phase locked loop circuit which has a serial clock signal output. A ring counter, coupled to the output of the phase locked loop circuit, outputs a plurality of parallel signals of different phase. Each of a plurality of AND gates are respectively coupled to the outputs of the ring counter. The serial clock output from the loop circuit is fed to the other input of each AND gate. The output of each AND gate is coupled to one of a plurality of latches. A second input of each latch is capable of receiving the serial stream of combined clock and data bits. When the serial stream is fed to the analog phase locked loop circuit and to each of the latches, the latches are sequentially set by substantially simultaneously received clock and data information at their first and second inputs such that serial data bits within the stream appear as parallel data bits at the latch outputs.

The present invention in essence provides for the simultaneous regeneration and deserialization of a serial digital stream of clock and data bits. Retiming is accomplished at a lower frequency than the input stream and, therefore, the circuit is capable of operation at a higher rate than existing retiming and deserialization techniques. Further, the simultaneous regeneration and deserialization of data results in a less complicated circuit, which is also less susceptible to noise and crosstalk.

BRIEF DESCRIPTION OF THE DRAWINGS

These and other objects, advantages and features of the present invention will be more readily understood from the following detailed description of certain preferred embodiments of the present invention, when considered in conjunction with the accompanying drawings in which.

DETAILED DESCRIPTION OF THE INVENTION

Figure 2:
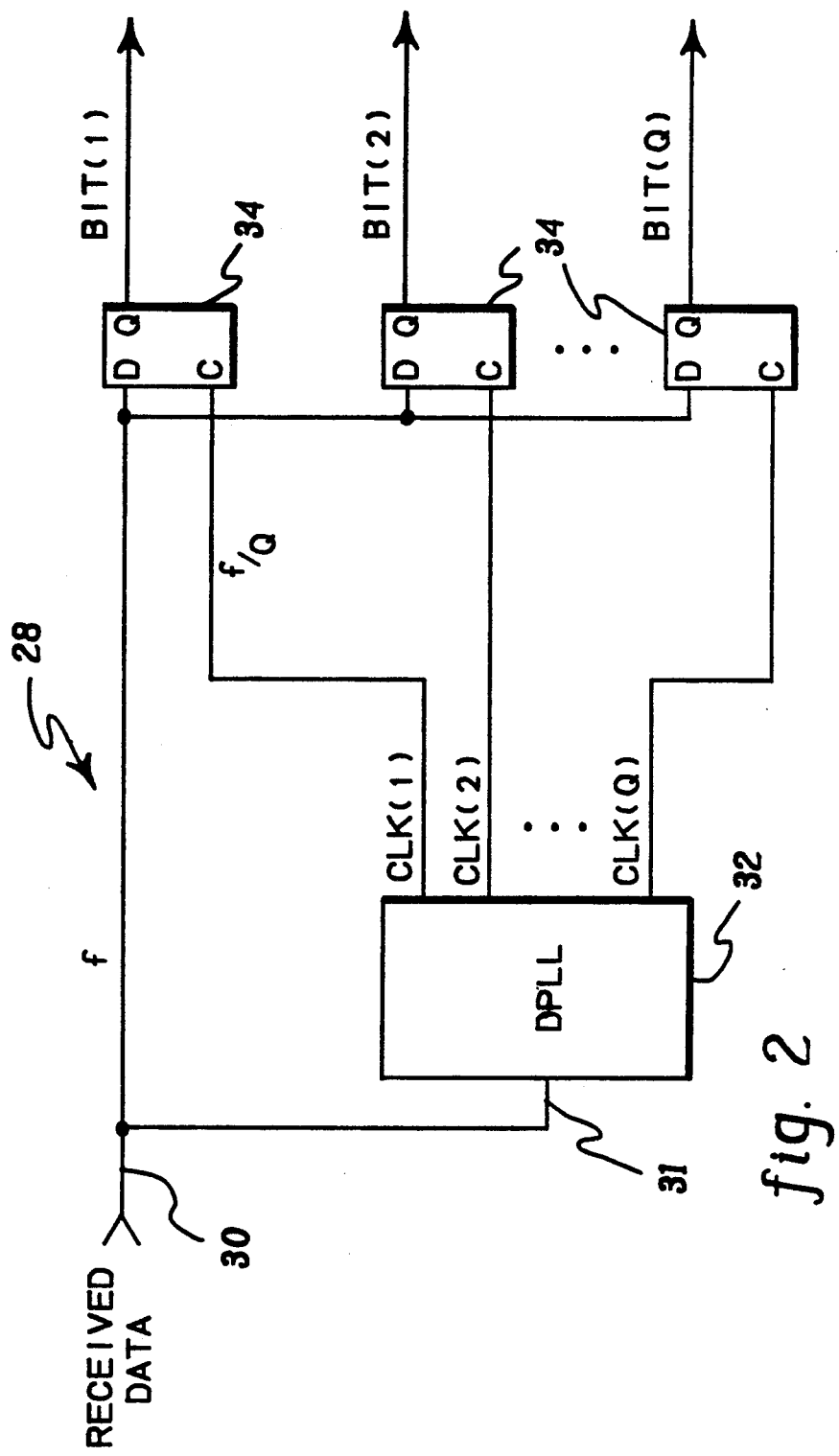
FIG. 2 is a block diagram representation of one circuit embodiment of the regeneration and deserialization technique of the present invention.

One embodiment of an efficient digital data regeneration and deserialization circuit, denoted 28, constructed pursuant to the present invention is depicted in FIG. 2. A serial clock and data stream to be deserialized into Q parallel channels (bits) is received on transmission line 30 which is coupled to an input 31 of a digital phase lock logic circuit 32. Phase lock loops are well known in the art and are commonly used for clock recovery from a stream of serially transmitted clock and data signals. Digital phase lock logic circuits (DPLLs) are also known in the art and may be preferred over analog PLL schemes depending upon the implementation. A general survey of DPLL circuits is given in an article by W. C. Lindsey et al.: "Survey of Digital Phase-Locked Loops", *Proceedings of The IEEE*, Vol. 69, No. 4, Apr. 1981, pp. 410–431. Also, a detailed implementation of a digital phase lock logic circuit is provided in U.S. Pat. No. 4,677,648, entitled: "Digital Phase Locked Loop Synchronizer," assigned to the same assignee as the present application, and the entirety of which is hereby incorporated herein by reference. DPLL circuit 32 has a plurality of clock outputs, CLK(1), CLK(2),..., CLK(Q), which contain clock signals of the same frequency, but different phase.

Retiming and deserialization are accomplished by Q edge triggered data latches 34 which have a clock input "C" coupled to a respective one of the DPLL circuit 32 outputs such that clock signals of different phase are received at each of latches 34. A second, data input "D" to each latch 34 is coupled to transmission line 30 for receiving the serial data stream. Data is latched on the rising or falling clock edge by each latch. As noted, the clock outputs from circuit 32 all have the same frequency fq that is 1/Qth the frequency "f" of the received data, i.e., fq=f/Q. Since the output clocks CLK(1), CLK(2), ..., CLK(Q) have different phases, clock CLK(j) is phase shifted Df(j) in reference to the CLK(1) clock, which is synchronized with the received data clock. The phase shift in degrees of any given clock signal can be determined from the following formula:

$$D(j) = 360° \cdot (j-1)/Q$$

where: j=1, 2, ..., Q. In this way, data bits are sequentially latched by one of the Q deserialization latches 34 such that serial data bits in the received data signal appear at the latch outputs as Q parallel data bits, Bit(1), Bit(2), ..., Bit(Q). After the Qth latch is reached, the parallel data word is sampled, i.e., transferred to a parallel register (not shown), and retiming is begun again from the first latch.

Figure 1:
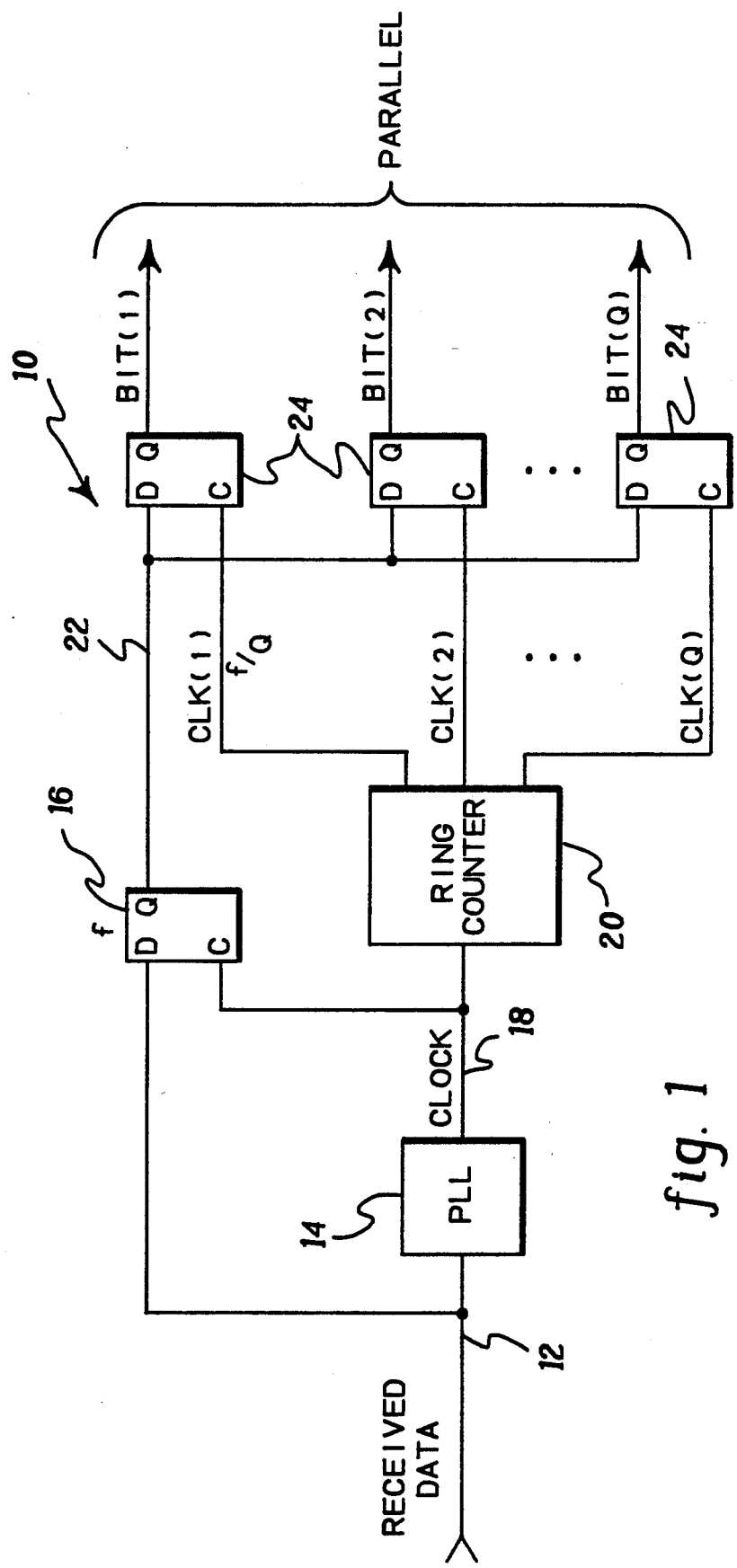
FIG. 1 is a block diagram representation of a prior art regeneration and deserialization circuit.

It will be observed from a comparison of FIG. 2 with FIG. 1, that the novel regeneration and deserialization circuit of the present invention eliminates retiming latch 16 of the prior art circuit. As noted before, this latch is operating at the same frequency as the received data. Latches 34 in the regeneration and deserialization circuit of FIG. 2, on the other hand, are each operating at f/Q. Thus, applicants' retiming latches are operating at a lower clock frequency than the frequency of the input data stream and, therefore, data can be reliably retimed and deserialized using existing technology at a higher rate than with the prior art technique of FIG. 1.

Figure 3:
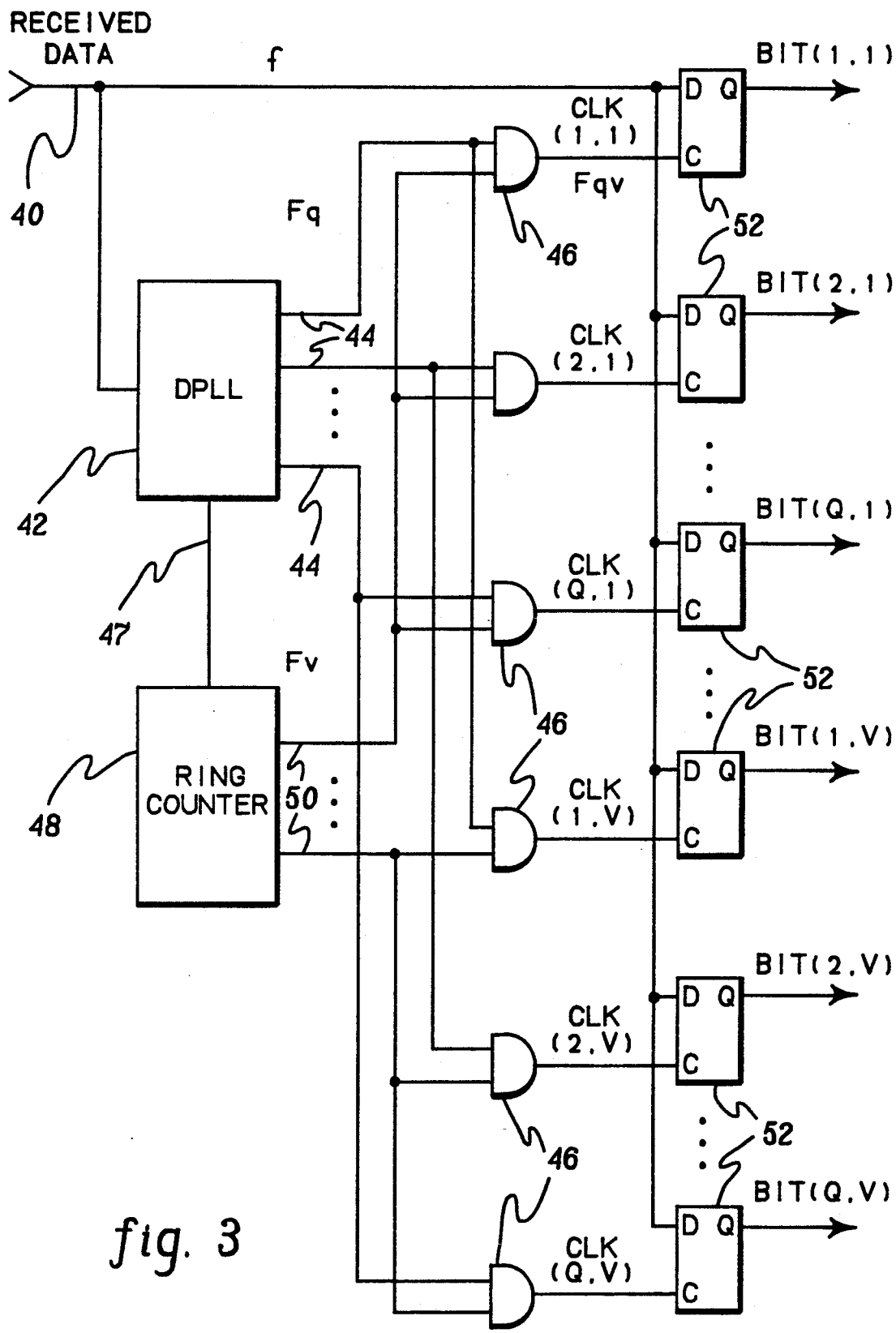
FIG. 3 is a block diagram representation of an enhanced version of the embodiment of the present invention depicted in FIG. 2.

In order to reduce the retiming clock frequency even further, groups of retiming and deserialization latches are used in place of the one group of Q latches described with reference to FIG. 2. FIG. 3 illustrates a retiming and deserialization circuit wherein V groups of Q latches are utilized. As in the embodiment of FIG. 2, the serial data stream is received on a transmission line 40 which is coupled to a digital phase locked logic circuit 42. Circuit 42 supplies clock signals of frequency Fq via a plurality of output lines 44. Each output line from circuit 42 is connected to an input of a respective one of a plurality of AND gates 46. DPLL circuit 42 also outputs a timing signal via line 47 to a ring counter 48, which switches through AND gates 46 the clock outputs on lines 44 from one group of Q latches to the next group with the frequency Fv. In particular, counter 48 has a plurality of outputs 50 which are respectively connected to the second inputs of AND gates 46 such that the output of counter 48 selects the particular AND gate to be activated. The output signals from AND gates 46 are respectively fed to a first, clock input of a plurality (i.e., "Q") of edge triggered data latches 52 and the serial data stream is fed to a second, data input to each latch 52. Retiming and deserialization are accomplished simultaneously by the V groups of Q latches (a total of Q·V latches). Latches are sequentially clocked by (Q·V) different clocks CLK(1,1) CLK(2,2), ..., CLK(Q,1), ..., CLK(1,V), CLK(2,V)... CLK(Q,V) which are output respectively from AND gates 46. Again, data is latched on the rising or falling clock edge by all latches. The clocks have the same frequency Fqv, that is 1/(Q·V) the serial data clock frequency f. Therefore:

$$Fqv = f/(Q \cdot V)$$

However, clock signals CLK(1,1), CLK(2,1), ... CLK(Q,1), CLK(1,V), CLK(2,V) have different phases and, since the CLK(1,1) clock has the same phase as the serial data clock, the CLK(j,i) clock phase shift Df(j,i) is determined by the following formula:

$$Df(j,i) = (360° \cdot (j-1)/Q) + (360° \cdot (i-1)/(Q \cdot V))$$

where
j=1, 2, ..., Q
i=1, 2, ..., V.

Figure 4:
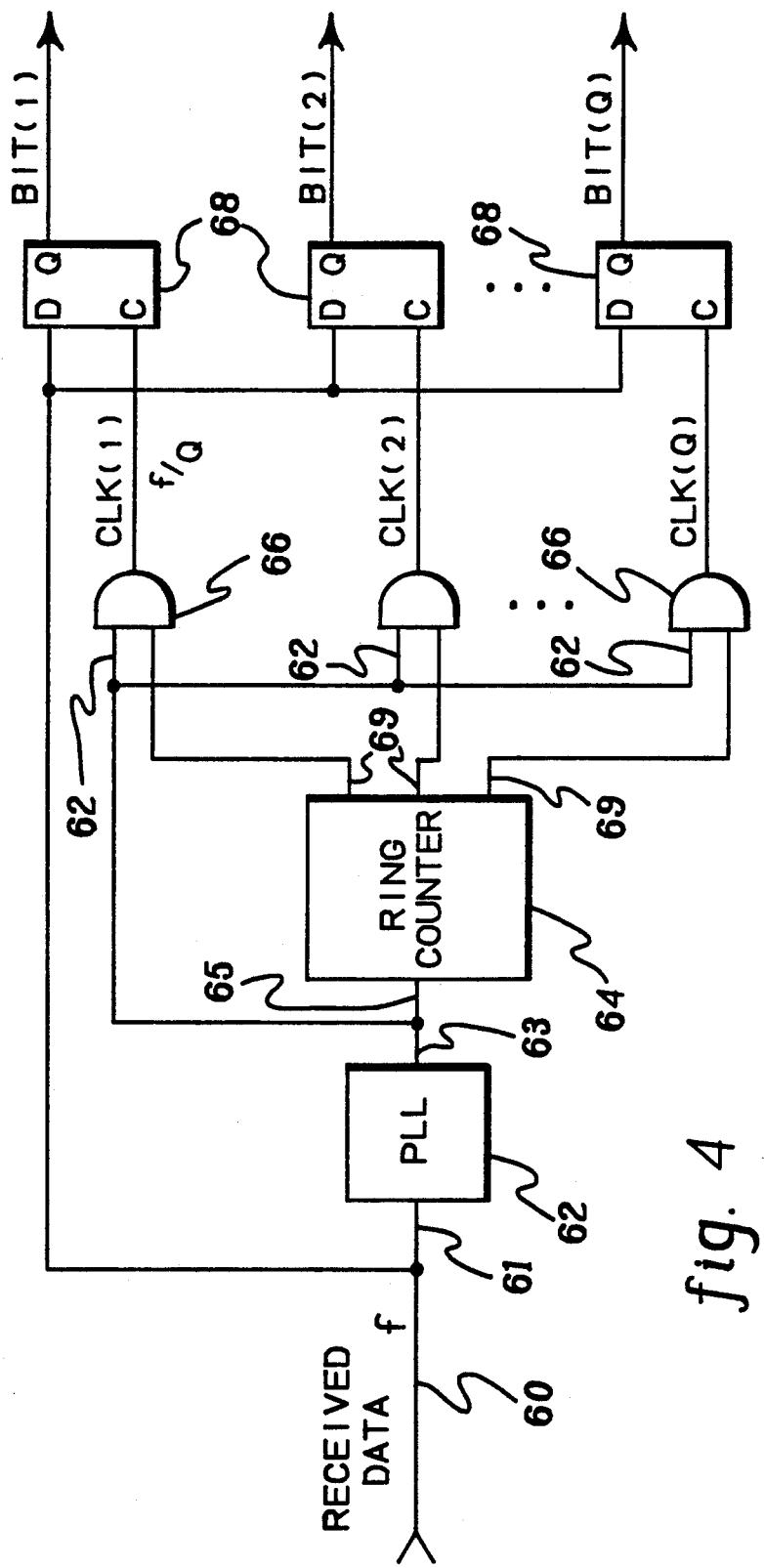
FIG. 4 is a block diagram representation of an alternate embodiment of the regeneration and deserialization circuit of the present invention.

FIG. 4 depicts an analog implementation of the regeneration and deserialization technique of the present invention. The serial data stream is received on line 60 which is coupled to an input 61 of an analog phase locked loop 62. The output 63 of circuit 62 contains a stream of clock signals. Output 63 is coupled to an input 65 of a ring counter 64 and a first input 67 of a plurality of AND gates 66. Counter 64 outputs in sequence Q signals of different phase on lines 69. The sequential signals on output lines 69 are respectively coupled to the second input of AND gates 66. Gates 66 produce at their output a plurality of clock outputs, CLK(1), CLK(2), ..., CLK(Q), which contain clock signals of the same frequency but different phase. These signals are input to the clock input 'C' of edge trigger data latches 68. The received data stream is also input directly to the data input 'D' of latches 68 such that data is simultaneously regenerated and deserialized by the latches with the output data being represented by Q parallel bits, Bit(1), Bit(2), ..., Bit(Q). Again data is latched on either the rising or falling clock edge by each latch. As with the DPLL implementation, latches 68 operate at 1/Qth the frequency of the serial data stream frequency "f". After the Qth latch is reached, the parallel data word is sampled and retiming is begun again from the first latch.

It will be observed from the above description that the present invention has the features initially set forth herein. In particular, a regeneration and deserialization circuit for converting serial data into a parallel data format is described which is less complicated than conventional techniques. The retiming latches of the present invention run at a lower clock frequency than that of the input data stream. Thus, assuming the same technology and circuit speed, the present technique can retime and deserialize data at a higher rate than pre-existing techniques. Further, applicants' regeneration and deserialization approach is less susceptible to noise and crosstalk because of the additional time between clock pulses at the retiming latches.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A regeneration and deserialization circuit for converting a serial signal stream of clock and data bits into a parallel data format having n parallel bit positions, said circuit comprising:
   n latches associated respectively with said n parallel bit positions, each latch having an input for receiving the serial signal stream, an output for providing data output for said respective bit position and a clock input for receiving a clock and latching data at the input in response thereto; and
   clock means for generating n clock signals, each having the frequency at which the parallel data is clocked and being staggered sequentially in phase by 1/n of the period of said n clock signals, said n clock signals being applied, respectively, to said n latches so as to latch the appropriate bit of data for the bit position for said latch.

2. A regeneration and deserialization circuit for converting a serial signal stream of clock and data bits into a parallel data format, said circuit comprising:
   a digital phase lock logic circuit having an input for receiving the serial signal stream and producing therefrom a plurality of clock outputs each of different phase; and
   a plurality of latches each having first and second inputs and an output, said first input of each latch being coupled to receive a respective clock output of said digital phase lock logic circuit, said second latch inputs being capable of each receiving said serial signal stream, wherein when said serial signal stream is fed to said digital phase lock logic circuit and to said latches, said latches are sequentially set by substantially simultaneously received clock and data information at said first and second inputs such that serial data bits within the signal stream appear as parallel data bits at the latch outputs.

3. The regeneration and deserialization circuit of claim 2, further comprising means for transmitting said serial signal stream to said circuit, and wherein said digital phase lock logic circuit input and said second inputs of said latches are each coupled to said serial signal transmitting means.

4. The regeneration and deserialization circuit of claim 2, wherein said plurality of latches are grouped into sets, and said digital phase lock logic circuit has a timing pulse output, and further comprising:
   a plurality of AND gates each having two inputs and an output, one input to each AND gate being connected to a respective clock output of said digital phase lock logic circuit, the outputs of said AND gates being respectively coupled to said first inputs of said latches; and
   a ring counter having an input coupled to said digital phase lock logic circuit to receive said timing pulse output of said logic circuit, said counter having a plurality of signal outputs each respectively coupled to the other of said inputs of said AND gates such that said signal outputs from said counter operate via said AND gates to sequentially switch said output clocks from the digital phase lock logic circuit between said latch sets.

5. A regeneration and deserialization circuit for converting a serial stream of clock and data bits into a parallel data format, said circuit comprising:
   an analog phase locked loop circuit having an input for receiving the serial clock and data stream and an output for transmitting a serial clock signal;
   a ring counter having an input coupled to receive the serial clock signal output from said loop circuit, said counter having a plurality of parallel signal outputs of different phase;
   a plurality of AND gates each having two inputs and an output, each AND gate having one input coupled to a respective ring counter clock output and its other input coupled to receive said loop circuit serial clock output whereby said AND gates have clock signal outputs of different phase; and
   a plurality of latches each having first and second inputs and an output, said first input of each latch being coupled to receive one of said AND gate clock outputs and said second latch inputs each being capable of receiving said serial stream of clock and data bits, wherein when said serial stream is fed to said analog phase locked loop circuit and to said latches, said latches are sequentially set by substantially simultaneously received clock and data information at said first and second inputs such that serial data bits within the stream appear as parallel data bits at the latch outputs.

6. The regeneration and deserialization circuit of claim 5, further comprising means for transmitting said serial stream of clock and data bits to said circuit, and wherein said analog phase locked loop circuit input and said second inputs to said latches are each coupled to said transmitting means.

* * * * *